United States Patent [19]

Buhler et al.

[11] Patent Number: 5,786,722
[45] Date of Patent: *Jul. 28, 1998

[54] INTEGRATED RF SWITCHING CELL BUILT IN CMOS TECHNOLOGY AND UTILIZING A HIGH VOLTAGE INTEGRATED CIRCUIT DIODE WITH A CHARGE INJECTING NODE

[75] Inventors: Steven A. Buhler, Sunnyvale; Jaime Lerma, Culver City, both of Calif.; Mohammad M. Mojarradi, Pullman, Wash.

[73] Assignee: Xerox Corporation, Stamford, Conn.

[*] Notice: The term of this patent shall not extend beyond the expiration date of Pat. No. 5,757,065.

[21] Appl. No.: 746,589

[22] Filed: Nov. 12, 1996

[51] Int. Cl.⁶ .................................................. H01L 29/868
[52] U.S. Cl. .......................... 327/503; 327/493; 257/275; 257/379; 257/533; 257/536

[58] Field of Search ........................ 257/275, 379, 257/528, 532, 533, 536, 544; 327/493, 503

[56] References Cited

U.S. PATENT DOCUMENTS

| | | |
|---|---|---|
| 3,035,186 | 5/1962 | Doucette. |
| 4,896,243 | 1/1990 | Chatterjee et al. ................ 257/379 |
| 5,081,517 | 1/1992 | Contiero et al. .................. 257/544 |

*Primary Examiner*—Jerome Jackson
*Attorney, Agent, or Firm*—Nola Mae McBain

[57] ABSTRACT

An integrated CMOS diode with an injection ring that enables construction of an integrated CMOS RF switch. Construction techniques of using a diffused n-well resistor, parasitic capacitance and construction of the diode underneath a bonding input pad contribute to performance of the switch as well as saving space needed to construct the switch.

11 Claims, 4 Drawing Sheets

INTEGRATED RF SWITCHING CELL BUILT IN CMOS TECHNOLOGY AND UTILIZING A HIGH VOLTAGE INTEGRATED CIRCUIT DIODE WITH A CHARGE INJECTING NODE

CROSS REFERENCE TO RELATED APPLICATIONS

This application is related to attorney docket number D96213 Ser. No. 08/726,456 titled "High Voltage Integrated Circuit Diode with a Charge Injecting Node", currently assigned to the assignee of this application and filed on Sep. 30th, 1996 and now U.S. Pat. No. 5,757,065.

BACKGROUND

This invention relates generally to RF switching cells and more particularly concerns an RF Switching cell built in CMOS technology and using a high voltage integrated circuit diode with an injecting node.

Acoustic inkjet printing applications use RF switch arrays to enable selection of an area to be printed. An example of an acoustic ink printhead can be found in U.S. Pat. No. 5,339,101 by Rawson et. al., assigned to Xerox Corporation, and herein incorporated by reference. Rawson et. al. describes an acoustic ink printhead and its operation including how to connect the printhead to an RF power source to enable the printhead to eject an ink droplet. Essentially, an RF input is used to excite a transducer and generate sound energy in the transducer. The sound energy from the transducers is then upwardly directed to toward a Fresnel lens which is used to focus the energy in a region of an upper surface of a body of ink. If the directed energy is above an ejection threshold, a droplet of ink is ejected from the printhead. A switch is used to connect and disconnect the RF signal from the transducer which turns the inkjet on or off and determines if a droplet will be ejected.

FIG. 1 shows such a switch as known in the prior art. Node 18 is connected to an inkjet transducer which has an RF signal source connected to it. P-i-N diode 10 which is connected between node 18 and ground is used as a switch for the RF signal source. Resistor 12, which is connected between node 18 and node 20, and capacitor 14 which is connected between node 20 and ground form a RC network which is used to isolate high voltage driver 16 from RF signals. High voltage driver 16 is connected between node 20 and node 22. Node 22 is connected to logic which determines if the switch be "on" or "off", i.e., whether the inkjet should be firing or not.

In operation, a logical "on" or "off" will be given to high voltage driver 16 from node 20. If a logical "on" is received, that is the inkjet is supposed to eject a droplet of ink, then high voltage driver 16 will drive node 20 to +15 volts. There will be current through resistor 12 and node 18 will also reside at +0.7 volts. P-i-N diode 10 will be connected between +0.7 volts and ground and will appear as a low impedance short to ground from node 18. The transducer in the inkjet will see a full voltage swing of the RF signal and the inkjet will fire.

If a logical "off" is received, the high voltage driver 16 will drive node 20 to −15 volts. A small amount of current will pass through resistor 12 and P-i-N diode 10 will appear as a low capacitance open switch to node 18. The transducer in the inkjet will see less than a full voltage swing of the RF signal and the inkjet will not fire.

Currently, P-i-N diodes, which are discrete components, are used in the RF switch arrays because they have the correct diode characteristics for efficient operation. Using discrete P-i-N diodes increases both the size and the cost of the RF switch arrays. Another impact of using discrete P-i-N diodes is that a discrete RC circuit is needed to isolate the P-i-N diode from a driver chip that will be used to drive the P-i-N diode. It would be preferable to use integrated diodes in building RF switch arrays, but current technological limitations have prevented their use. This is because current CMOS integrated diodes are not capable of sustaining the performance requirements necessary for the RF switch array.

A perfect diode would have a high impedance value when the diode is reversed biased and a low impedance value when the diode is forward biased. However, in all previous diodes built using CMOS technology these two requirements are contradictory due to the nature of doping profiles. A high impedance value when the diode is reversed biased means a high on-resistance value when the diode is forward biased and there is a high capacitance value when the diode is reversed biased if there is a low impedance value when the diode is forward biased. An additional problem is that ordinary n+ or p+ CMOS diodes have low breakdown voltages and high capacitance values.

However, a technique using an injecting node in an integrated diode has been found which allows for the fabrication of a CMOS integrated diode with diode characteristics more closely resembling the characteristics of a discrete P-i-N diode.

With the introduction of an integrated CMOS diode with diode characteristics more closely resembling the characteristics of a discrete P-i-N diode a completely integrated RF switching cell can be built using CMOS technology.

Accordingly, it is the primary aim of the invention to provide a method of fabricating an integrated RF switching cell with CMOS circuitry including an integrated high voltage CMOS diode.

Further advantages of the invention will become apparent as the following description proceeds.

SUMMARY OF THE INVENTION

Briefly stated and in accordance with the present invention, there is provided an integrated RF switching cell including an integrated high voltage CMOS diode.

Figure 1:
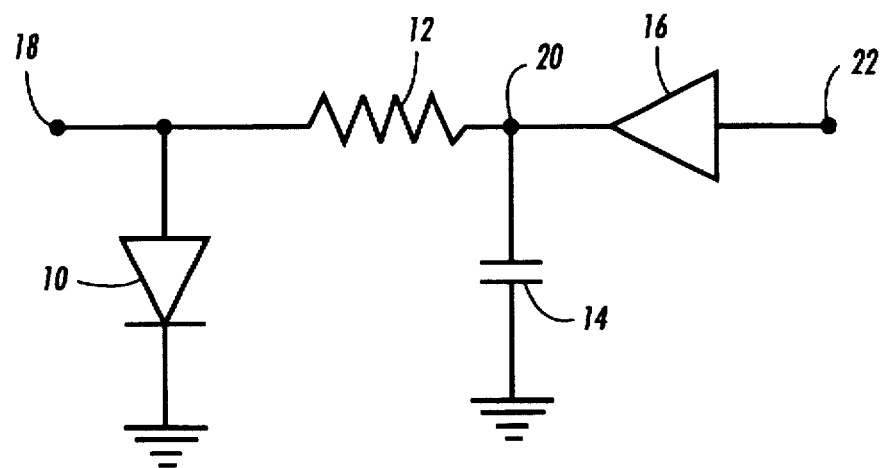
FIG. 1 is a prior art schematic of an RF switch.

While the present invention will be described in connection with a preferred embodiment and method of use, it will be understood that it is not intended to limit the invention to that embodiment or procedure. On the contrary, it is intended to cover all alternatives, modifications and equivalents as may be included within the spirit and scope of the invention as defined by the appended claims.

Alpha-Numeric List of Elements

C centerline C
D1 depth d1
$V_b$ bias voltage
10 P-i-N diode 10
12 resistor 12
14 capacitor 14
16 high voltage driver 16
18 node 18
20 node 20
22 node 22
24 diode 24
26 p− epi anode 26
28 n-well cathode 28
30 n+ injecting node 30
32 p− epi anode contact 32
34 p− epi 34
36 n+ metal contact 36
38 metal line 38
40 metal line 40
42 p+ substrate 42
44 RF switch subcircuit
46 n-well resistor 46
50 RF input bonding pad 50
52 node 52
54 switch input node 54
56 ground metal 56
58 capacitor 58
60 diode injecting node driver 60
62 high voltage driver 62
64 high voltage level translator 64
66 node 66
68 node 68
70 PMOS transistor 70
72 PMOS transistor 72
74 75 volt voltage source 74
76 PMOS transistor 76
78 high voltage transistor 78

DETAILED DESCRIPTION OF THE INVENTION

Figure 2:
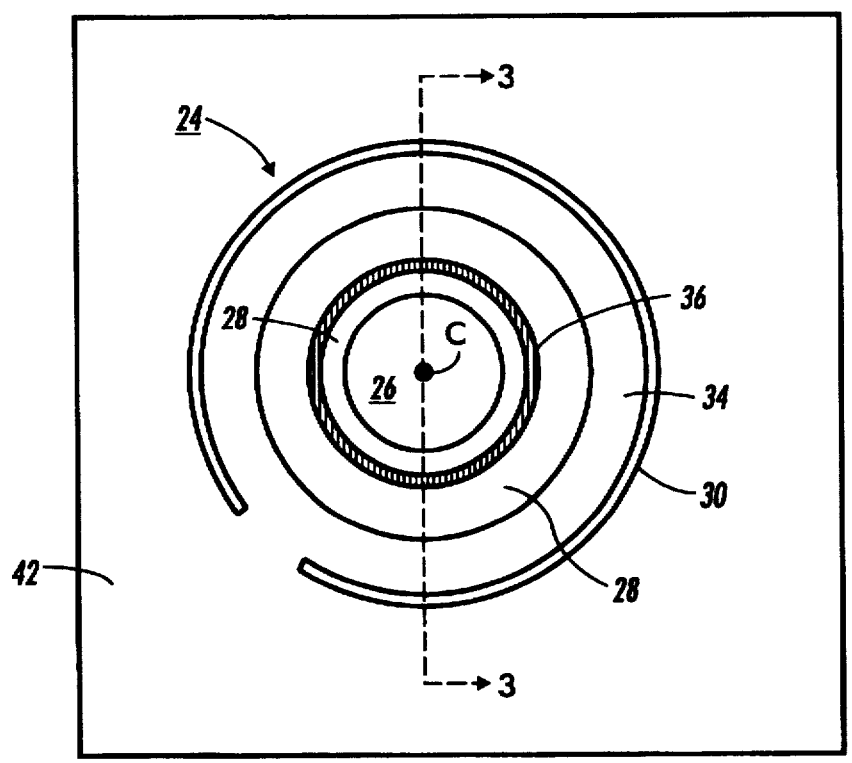
FIG. 2 is a top view of a CMOS integrated circuit diode made according to the present invention.
Figure 3:
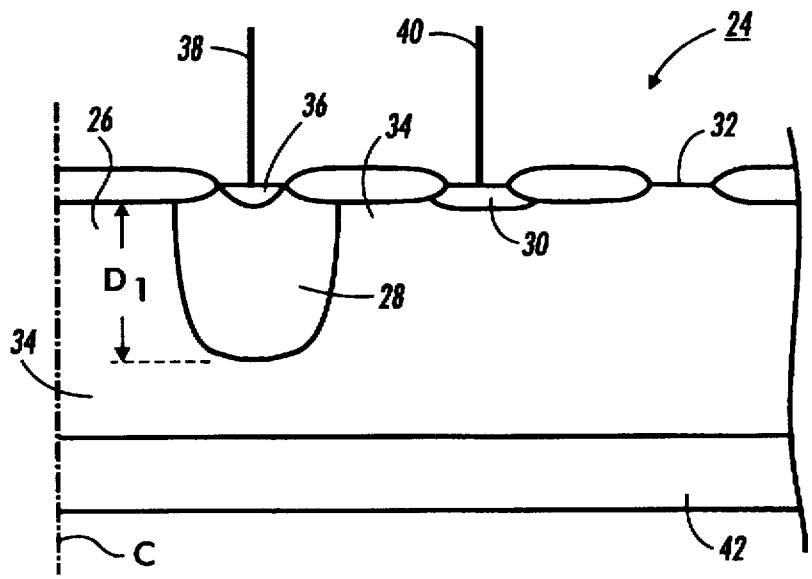
FIG. 3 is a cross-sectional view of the CMOS integrated circuit diode shown in FIG. 2 and taken through cross-section line 3—3.

Turning now to FIG. 2, a top view of a CMOS integrated circuit diode 24, which enables the production of a completely integrated RF switching circuit, can be seen. FIG. 3 shows a cross-sectional view of the CMOS integrated circuit diode 24 shown in FIG. 2 and taken through cross-section line 2—2. This diode 24 is constructed using well-known CMOS fabrication processes; therefore, attention will be spent detailing the layout of the diode 24. It should be noted that this device could also be constructed using P-well CMOS fabrication processes with complementary doping and technology.

The diode 24 itself is a cylindrical device with a centerline C. The diode 24 is constructed by implanting a ring to form a n-well cathode 28 in a substrate comprised of p+ substrate 42 and p− epi 34 leaving a p− epi anode 26 in the center. N-well cathode 28 is implanted approximately 4 microns deep as shown by depth d1, but can be anywhere within the range of 3.5 microns to 4.5 microns. The n-well cathode 28 starts at a distance of approximately 30 microns from the centerline C and is approximately 18 microns wide; however, dimensions of approximately 5 microns to 40 microns for distance from the centerline and a width of approximately 80 microns to 30 microns are acceptable depending on the particular breakdown and RF switching characteristics desired. In the specific example cited the diode 24 will have an approximately 180 volt breakdown voltage and a 0.25 pf off capacitance. The n-well cathode 28 is connected to electrically by a n+ metal contact 36. Using the n+ metal contact 36 the n-well cathode 28 can now be connected to using a metal line 38.

The p− epi anode 26 of the diode 24 created by n-well cathode 28 is connected to ground via a topside p− epi anode contact 32 as shown in FIG. 2. The p+ substrate 42 is connected to ground via a backside wafer contact (not shown). As shown in FIG. 3 the depth of the p− epi 34 is approximately 15 microns (before processing) although depths in any range from approximately 15 microns to 25 microns will be adequate. Decreasing the depth of the p− epi 34 increases the capacitance and off impedance, and decreases the breakdown voltage. It is anticipated that the device will fail at depths of less than 12 microns. However, increasing the depth of p− epi 34 increases the on-impedance of the diode 24; therefore, it is preferable to keep the depth to less than 25 microns.

The new component of the diode 24 is a n+ injecting node 30 forming a broken ring outside of the n-well cathode 28 and separated from it by a portion of the p− epi 34 region. Ideally the n+ injecting node 30 would not be broken; however, breaking the ring is necessary for connections to other circuitry, in this design. It is conceivable that alternative designs would not require the n+ injecting node 30 ring to be broken. The n+ injecting node 30 is implanted approximately 0.3 microns deep but values from approximately 0.3 microns to 1 micron are acceptable. The n+ injecting node 30 is approximately 6 microns wide, but values of approximately 1 microns to 20 microns are also acceptable. The distance the n+ injecting node 30 is located from the centerline C will vary depending on what breakdown voltage is desired. As an example, a distance of approximately 15 microns will result in a breakdown voltage of approximately 180 volts via simulations using a two dimensional device simulation program, specifically Technology Modeling Associates' Medici program, when parameters such as the ones given above are used for the other elements of the diode. For the n+ injecting node 30 to operate correctly it must be spaced at least 1 micron from the n-well cathode 28 to avoid shorting out with n+ injecting node 30 with the n-well cathode 28. However, the breakdown voltage decreases as the n+ injecting node 30 is placed closer to the n-well cathode 28, so it must be expected that the breakdown voltage will be very low if the minimum distance is used.

The n+ injecting node 30 alters the characteristics of the diode 24 by biasing the diode in either a forward biased mode or a reverse biased mode during operation of the diode 24. When the n+ injecting node 30 is forward biased, there is a negative bias on the n+ injecting node 30 as referenced against the p− epi anode 26 and the p− epi 34. The forward bias on the n+ injecting node 30 injects electrons into both the p− epi 34 and the p− epi anode 26. The n-well cathode 28 then drops to a voltage of approximately negative 0.7 volts, or 0.7 volts below the p− epi anode 26 and the p− epi 34, and the diode 24 remains turned on as long as there are electrons in the p− epi 34 and the p− epi anode 26. The injected electrons from the forward biased n+ injecting node 30 reduce the on-impedance of the diode 24. This biasing and impedance setting feature allows the diode 24 to handle a large RF voltage signal when the diode is turned off and to handle a large RF current signal when the diode is turned on.

The on-impedance of the diode 24 can be varied by changing the amount of current injected into the n+ injecting node 30. When there is no current, the diode 24 acts as a normal two-terminal diode because there are no injected electrons to reduce the on-impedance. However, as the current into the n+ injecting node 30 rises, more electrons are injected and the on-impedance is lowered. Tests on one device showed an on-impedance of 78.9 ohms with a small current of 0.4 mA into the n+ injecting node 30. As the current was increased to 3.1 mA the on-impedance dropped to 38.5 ohms. As the current was increased to 6.25 mA the on-impedance dropped to 35.9 ohms.

When the n+ injecting node 30 is reverse biased there is a positive bias on the n+ injecting node 30 as referenced against the p– epi 34. When there is a forward bias on the n+ injecting node 30 no electrons are injected into the p– epi 34. The diode 24 then behaves as it normally would; however, with the n-well cathode 28 and p– epi 34 doping values the diode 24 has a low reversed biased capacitance.

Figure 4:
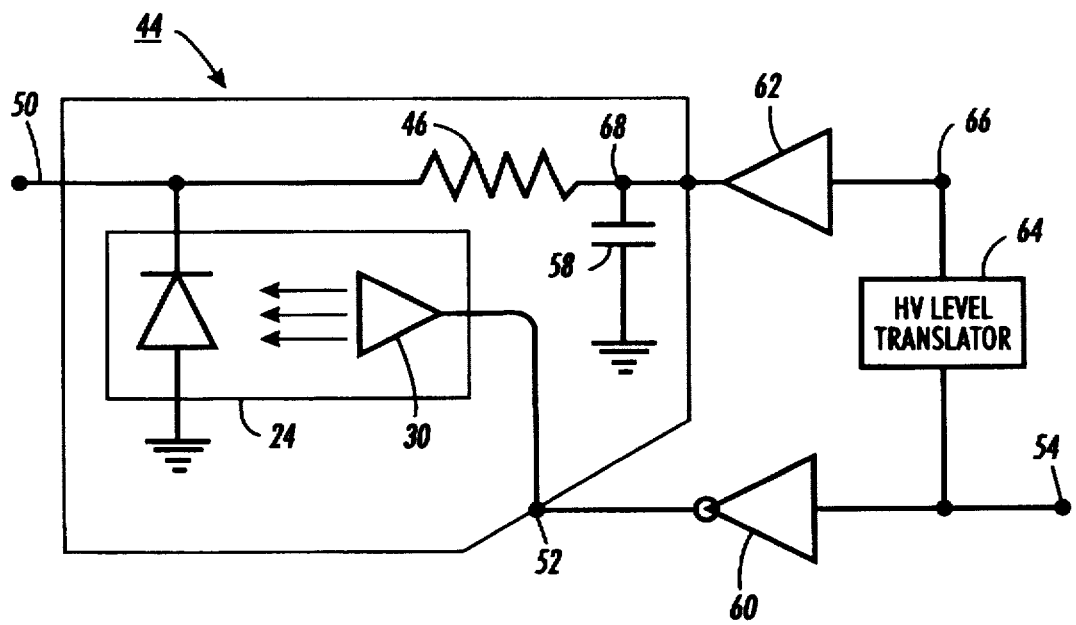
FIG. 4 is a schematic diagram of an RF switching circuit utilizing the CMOS integrated circuit diode shown in FIG. 3.

FIG. 4 shows a schematic diagram of a RF switch according to the present invention. A RF input bonding pad 50 is equivalent to node 18 in the prior art circuit shown in FIG. 1. A switch input node 54 is equivalent to node 22 in the prior art circuit shown in FIG. 1. The P-i-N diode 10 in FIG. 1 has been replaced with a diode 24 constructed as discussed above. The cathode of the diode 24 is connected to RF input bonding pad 50 and the anode of the diode 24 is connected to ground. The n+ injecting node 30 of the diode 24 is driven by a diode injecting node driver 60 at node 52, the diode injecting node driver 60 is in turn controlled by switch input node 54.

The diode injecting node driver 60 must be able to drive from 0 volts to –1 volt, voltages to operate the diode 24 correctly by activating or inactivating the n+ injecting node 30. However, using a larger swing such as from +5 volts to –5 volts will speed up the switching speed of diode 24. Such drivers are known in the art; one particular CMOS driver which is suited to this application is described in U.S. Pat. No. 5,321,293 by Mojaradi et.al. titled "Integrated Device Having MOS Transistors which Enable Positive and Negative Voltage Swings" and herein incorporated by reference. In this example, the diode injecting node driver 60 is designed to output a +5 volt signal to the n+ injecting node 30 when a logical "off" is received and a –1 volt signal while delivering 5 mA of current at node 52 when a logical "on" is received.

The high voltage driver 16 of FIG. 1 has been replaced with high voltage driver 62 connected between node 66 and node 68 in FIG. 4. The high voltage driver 62 drives up to 75 volts in contrast to the 15 volts in the circuit shown in FIG. 1. The function of the driver is to quickly remove any residual minority carriers stored in the diode 24 and then to bias the diode in the low capacitance reverse bias region.

Figure 5:
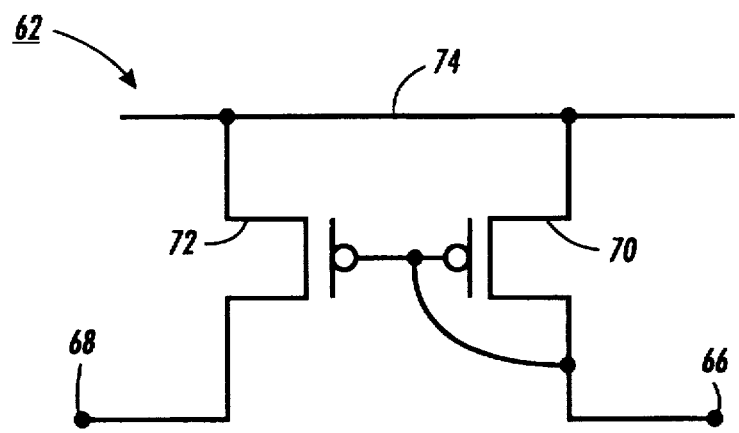
FIG. 5 is a schematic diagram of a high voltage driver circuit used in the RF switching circuit of FIG. 4.

One implementation of the high voltage driver 62 is shown in FIG. 5. It includes two PMOS transistors 70, 72 and a 75 volt voltage source 74. PMOS transistor 72 is connected between the 75 volt voltage source 74 and node 68. PMOS transistor 70 is connected between the 75 volt voltage source and node 66. The gates of the two PMOS transistors 70, 72 are tied together as well as to node 66.

Figure 6:
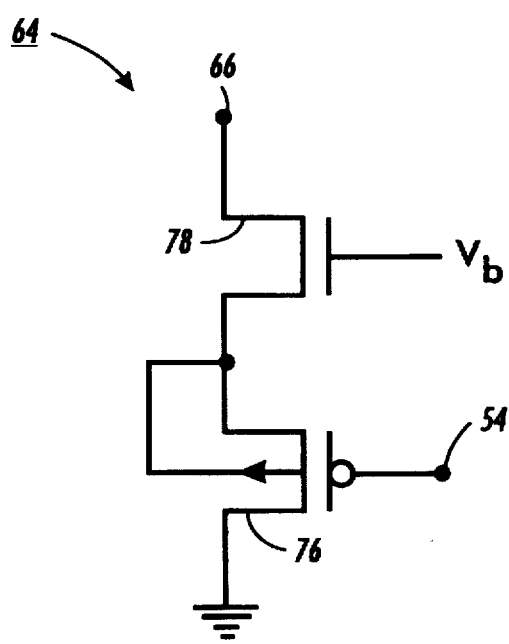
FIG. 6 is a schematic diagram of a cascode pair used in the RF switching circuit of FIG. 4.

Another new element included in FIG. 4 is a high voltage level translator 64 between switch input node 54 and node 66. The high voltage level translator 64 is used to insure that the high voltage driver 62 can be correctly driven by the signal coming in on the switch input node 54 and can be implemented in a variety of ways including a cascode pair as shown in FIG. 6. The cascode pair contains two transistors, a PMOS transistor 76 and a high voltage transistor 78. The two transistors are connected in series to each other between node 66 and ground. Node 66 is a high voltage node and therefore, high voltage transistor 78 is connected to it. High voltage transistor 78 also has a bias voltage $V_b$ connected driving its gate which insures that the high voltage transistor 78 is always operating in its "on" state. PMOS transistor 76 is driven by the signal on switch input node 54.

Finally, n-well resistor 46 and capacitor 58 are essentially the same elements as resistor 12 and capacitor 14 shown in FIG. 1.

In operation, the RF switching circuit works as follows. When the diode 24 is turned off, it can sustain a large RF voltage across it, but little or no current will pass through it. When the diode 24 is turned on, large amounts of current may pass through it but there will be little or no voltage drop across the diode 24. The condition of firing an inkjet requires the diode 24 to be turned on so that the RF voltage can be seen by the inkjet.

To turn the diode 24 on, n+ injecting node 30 must be turned on and operating in injecting mode; therefore, the diode injecting node driver 60 should be driving a –1 volt signal to node 52 and the n+ injecting node 30. At the same time, the high voltage driver 62 must be in the low state and not driving RF input bonding pad 50 to a high voltage. The diode 24 will set the RF input bonding pad 50 to a voltage of –0.7 volts and there will be a negative voltage between the RF input bonding pad 50 and ground.

However, when the inkjet is not to be fired, the opposite conditions are required. The diode 24 must be turned off, allowing it to sustain a large RF voltage drop across it but little current flow through it. In this case, the n+ injecting node 30 must not be operating in injection mode. To turn the n+ injecting node 30 off the diode injecting node driver 60 must be driving a voltage of 0 volts or greater, and in this example drives a voltage of +5 volts to node 52 and the n+ injecting node 30. At the same time, the high voltage driver 62 must be in the on state and driving the RF input bonding pad 50 to a high voltage.

Figure 7:
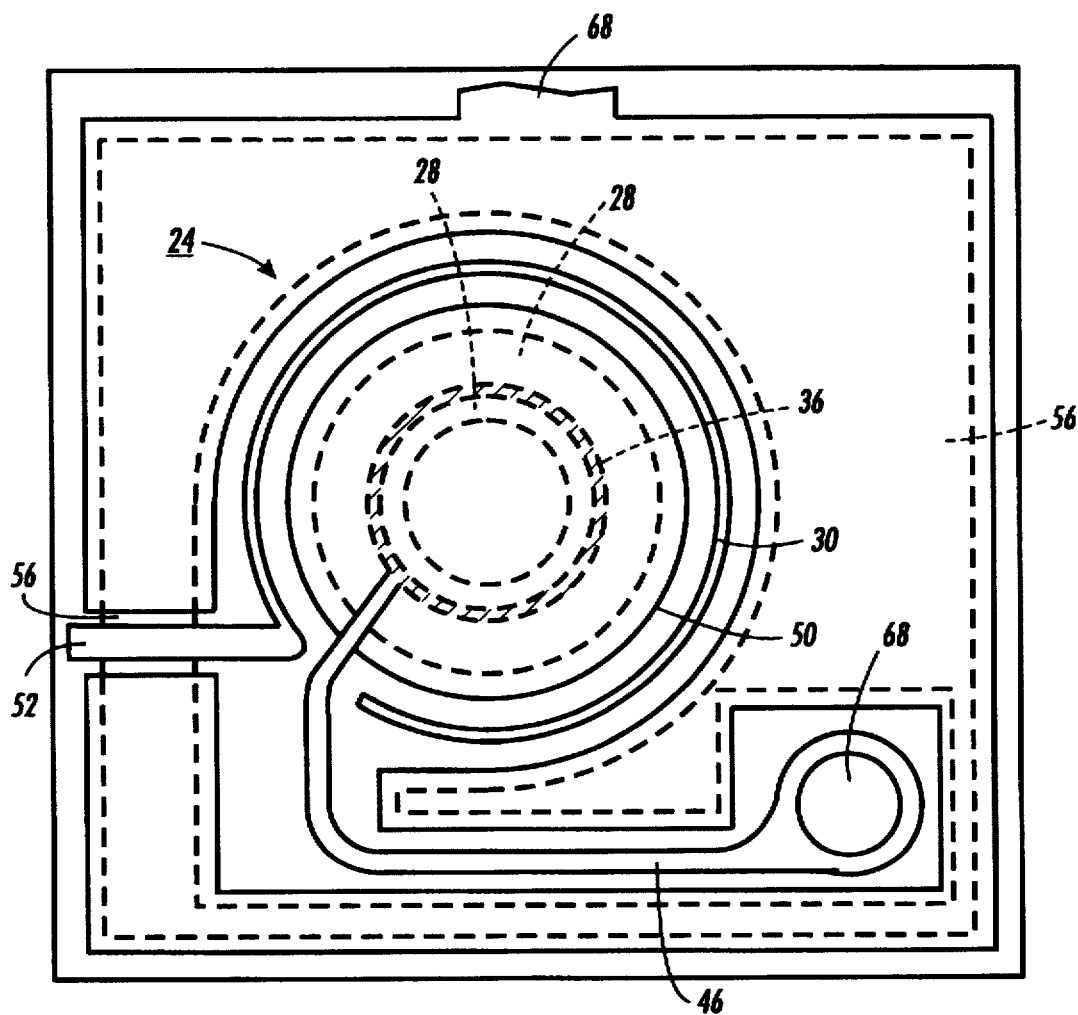
FIG. 7 is a top view of an RF switching subcircuit shown in the schematic of FIG. 4.

FIG. 7 shows a top layout view of an RF switching subcircuit 44 including the diode 24, capacitor 58, ground metal 56, and the n-well resistor 46 along with RF input bonding pad 50 to illustrate some space saving layout techniques used with the RF switching subcircuit 44.

First the diode 24 is constructed underneath the RF input bonding pad 50. This reduces parasitic capacitances between the diode 24, the RF input bonding pad 50 and ground by reducing the length of metal lines connecting the diode 24 to the RF input bonding pad 50. This helps to keep the off impedance of the diode 24 as large as possible because parasitic capacitances reduce the off impedance of the diode 24.

Second, the n-well resistor 46 is constructed using a diffused n-well resistor and the capacitor 58 is constructed using expanded route metal for node 68 over ground metal 56 to create capacitor 58. Normally, these two components would be laid out as two separately constructed devices; however, by taking advantage of the parasitic capacitance then the capacitor 58 does not need to be constructed as a separate element.

We claim:

1. A CMOS integrated RF switch comprising:

a) an RF signal input node, b) a logical input node, c) a diode with an anode, cathode, and charge injecting node, with the cathode being connected to said RF signal input and the anode being connected to ground, d) a charge injecting node driver with an input and an output which is capable of driving a negative signal and up to at least a 0 volt signal, with the charge injecting node driver input connected to said logical input and the charge injecting node driver output connected to the charge injecting node of said diode, e) a high voltage level translator with an input and an output, with the high voltage level translator input connected to said logical input, f) a high voltage driver with an input and an output, with the high voltage driver input connected to the high voltage level translator output, and g) an RC filter connected between the high voltage driver output and said RF signal input.

2. The RF switch of claim 1 wherein said diode resides in a substrate and comprises:

a) a substrate with an upper portion and a lower portion wherein the upper portion has an upper portion depth and an upper portion surface, and the lower portion is substantially uniformly heavily doped with a first carrier type and has a lower portion depth, b) an anode area lightly doped with a first carrier type in the upper portion of said substrate, said anode area having an anode area width and an anode area depth, c) a cathode area contiguous with the anode area and completely surrounding the anode area at least at the upper portion surface doped with a second carrier type, said cathode area being in the upper portion of said substrate, having a cathode area depth which is less than the upper portion depth of the upper portion of said substrate wherein there is a portion of said anode area between said cathode area and the lower portion of said substrate, and said cathode area having a cathode area width, d) a third area contiguous with the cathode area and completely surrounding the cathode area at least at the upper portion surface, said third area also being contiguous with the portion of said anode area between said cathode area and the lower portion of said substrate, said third area being doped identically to the anode area and having a third area width, and e) an injecting node contiguous with the third area and substantially surrounding the third area at least at the upper portion surface that is heavily doped with the second carrier type, said injecting node having an injecting node depth that is less than cathode area depth wherein there is a portion of said third area between said injecting node and the lower portion of said substrate and said injecting node having an injecting node width.

3. The RF switch of claim 2 wherein the first carrier type is a p type and the second carrier type is an n type.

4. The RF switch of claim 2 wherein the first carrier type is an n type and the second carrier type is a p type.

5. The RF switch of claim 2 wherein the anode area is circular, the cathode area is annular, the third area is annular, and the injecting node is substantially annular.

6. The RF switch of claim 1 wherein said high voltage level translator comprises a cascode pair.

7. The RF switch of claim 1 wherein the RF switch resides in a substrate, said RF signal input node is constructed as a pad on top of said substrate and overlays said diode.

8. The RF switch of claim 1 wherein said RC filter comprises a resistor with two ends wherein one end is connected to said RF signal input node and the other end is connected to said high voltage driver output, and a capacitor with two ends wherein one end is connected to said high voltage driver output and the other end is connected to ground.

9. The RF switch of claim 8 wherein the RF switch resides in a substrate and said resistor is constructed as a diffused n-well resistor.

10. The RF switch of claim 8 wherein the RF switch resides in a substrate and said capacitor is constructed utilizing a parasitic capacitance.

11. The RF switch of claim 1 wherein the charge injecting node driver is capable of driving a signal from −1 volt to +5 volts.

* * * * *